United States Patent [19]

Kamiya et al.

[11] Patent Number: 4,853,745
[45] Date of Patent: Aug. 1, 1989

[54] EXPOSURE APPARATUS

[75] Inventors: Saburo Kamiya, Yokohama; Kazuaki Suzuki, Tokyo; Akikazu Tanimoto, Yokohama, all of Japan

[73] Assignee: Nikon Corporation, Tokyo, Japan

[21] Appl. No.: 210,808

[22] Filed: Jun. 24, 1988

[30] Foreign Application Priority Data

Jul. 3, 1987 [JP] Japan ................ 62-165415

[51] Int. Cl.$^4$ .......................................... G03B 27/52
[52] U.S. Cl. .......................... 355/43; 355/53; 356/401
[58] Field of Search ............ 355/43, 53, ; 356/400, 356/401

[56] References Cited

U.S. PATENT DOCUMENTS

| 4,395,117 | 7/1983 | Suzuki | 355/43 |
| 4,629,313 | 4/1986 | Tanimoto | 355/53 |
| 4,794,426 | 12/1988 | Nishi | 355/43 |

FOREIGN PATENT DOCUMENTS 53-56975 5/1978 Japan .
58-7824 7/1983 Japan .

Primary Examiner—L. T. Hix
Assistant Examiner—D. Rutledge
Attorney, Agent, or Firm—Shapiro and Shapiro

[57] ABSTRACT

An exposure apparatus for exposing to a substrate the image of the desired pattern of a mask having a mark and a desired pattern formed thereon. Light source for illuminating the mask by at least part of the laser light from the light source, a projection optical system, movable stage, position detecting for detecting the relative position of the stage and the mask and outputting a position signal, a fiducial member formed integrally with the stage, the fiducial member having a fiducial pattern disposed thereon. A second illuminating optical system for illuminating the fiducial pattern from the opposite side of the projection optical system with respect to the fiducial member. The second illuminating optical system having a plurality of reflecting members for directing at least part of the laser light from the light source to the fiducial pattern. Normalizing a second detection signal on the basis of a first detection signal, and processing for determining the position of the image of the mark formed on the predetermined surface by the projection optical system, on the basis of a position signal and the second normalized detection signal.

16 Claims, 4 Drawing Sheets

EXPOSURE APPARATUS

BACKGROUND OF THE INVENTION

1. Field of the Invention

This invention relates to an apparatus for measuring the relative position of a mask and a stage in an exposure apparatus.

2. Related Background Art

In recent years, semiconductor integrated circuits have enhance their degree of integration more and more and it has become required that the minimum line width of the circuit be formed in submicrons. In accordance therewith, higher resolving power and higher alignment accuracy have become desired for projection exposure apparatuses for the manufacture of semiconductor circuits.

Now, to enhance the resolving power, it is conceivable to make exposure radiation into radiation of shorter wavelength. So, nowadays, an excimer laser emitting a light in the ultraviolet range, represented by KrF laser, has been attracting attention as a radiation source for exposure.

The excimer laser is a pulse laser of high luminance and high output having many oscillation wavelengths in the ultraviolet range. Particularly, KrF laser oscillating at the wavelength of 248 nm is regarded as being most promising as the radiation source for the exposure apparatus in the next generation.

When alignment of a mask and a wafer is to be effected by the use of the excimer laser as the exposure radiation source, particularly, when off-axis type alignment in which the exposure position and the alignment position differ from each other is to be effected, the measurement of the position of the mask poses a problem. That is, in a conventional apparatus using a superhigh-pressure mercury lamp as a light source, where the exposure radiation is used as the mask alignment light, it is easy to accomplish the alignment by a photoelectric microscope or a TV image because the g-line (wavelength 435.8 nm) output from the super-high-pressure mercury lamp is a continuously emitted light, and on the other hand, where the excimer laser is used as alignment light, the alignment by a photoelectric microscope or a TV image is very difficult because the excimer laser emits a pulse light.

However, although the excimer laser is a radiation source which emits a pulse light, it is relatively easy to detect the quantity of light thereof or the peak power thereof by the use of a photodiode or the like. Accordingly, even where the excimer laser is used, it is possible to accomplish alignment by a method as described hereinafter. That is, a regulation plate having, for example, a slit-like opening is provided on a stage holding a substrate such as a wafer thereon, and the regulation plate is illuminated from below it by the excimer laser which is exposure radiation, and the image thereof is formed on a pattern surface. Then, by moving the stage, the corresponding window of a mask is scanned by the projected image of the opening of the regulation plate. In this case, when the projected image of the opening coincides with said window, a maximum quantity of light passes, and the quantity of light decreases in conformity with the deviation therebetween. Accordingly, by recording the variation in the quantity of light in the above-described case, the relative position of the regulation plate, namely, the stage, and the mask can be known.

So, recently, there has been conceived an exposure apparatus which, by the utilization of the above-described principle, is designed to transmit the excimer laser to below the regulation plate by the use of an optical fiber, and illuminate the regulation plate from below it.

In the apparatus wherein, as described above, the excimer laser is applied to the regulation plate through the optical fiber, there has been the problem that there occurs interference of speckles or the like peculiar to a single wavelength light (coherent light) such as the excimer laser, which in turn leads to low measurement accuracy.

SUMMARY OF THE INVENTION

The present invention has been made in view of such a problem and the object thereof is to provide an exposure apparatus in which even when measurement of the relative position of a stage and a mask is effected by the use of an excimer laser (coherent light), interference of speckles or the like does not occur and position measurement and alignment of good accuracy can be accomplished.

The exposure apparatus according to the present invention is provided with a fiducial member having a fiducial pattern lying on the imaging plane, a plurality of reflecting members for changing the optical path of a light having branched off from a main illuminating system and directing the light into the stage, and regulating means for regulating the diameter of the light directed into the stage, the light having branched from the illuminating optical system being transmitted through the plurality of reflecting members so as to illuminate the fiducial member, thereby solving the above-noted problem.

In the present invention, the light having branched off from the main illuminating system is directly transmitted to the regulating means by a mirror system or the like without the intermediary of an optical fiber or like member and therefore, the possibility that interference of speckles or the like may occur is eliminated.

DESCRIPTION OF THE PREFERRED EMBODIMENTS

Figure 1:
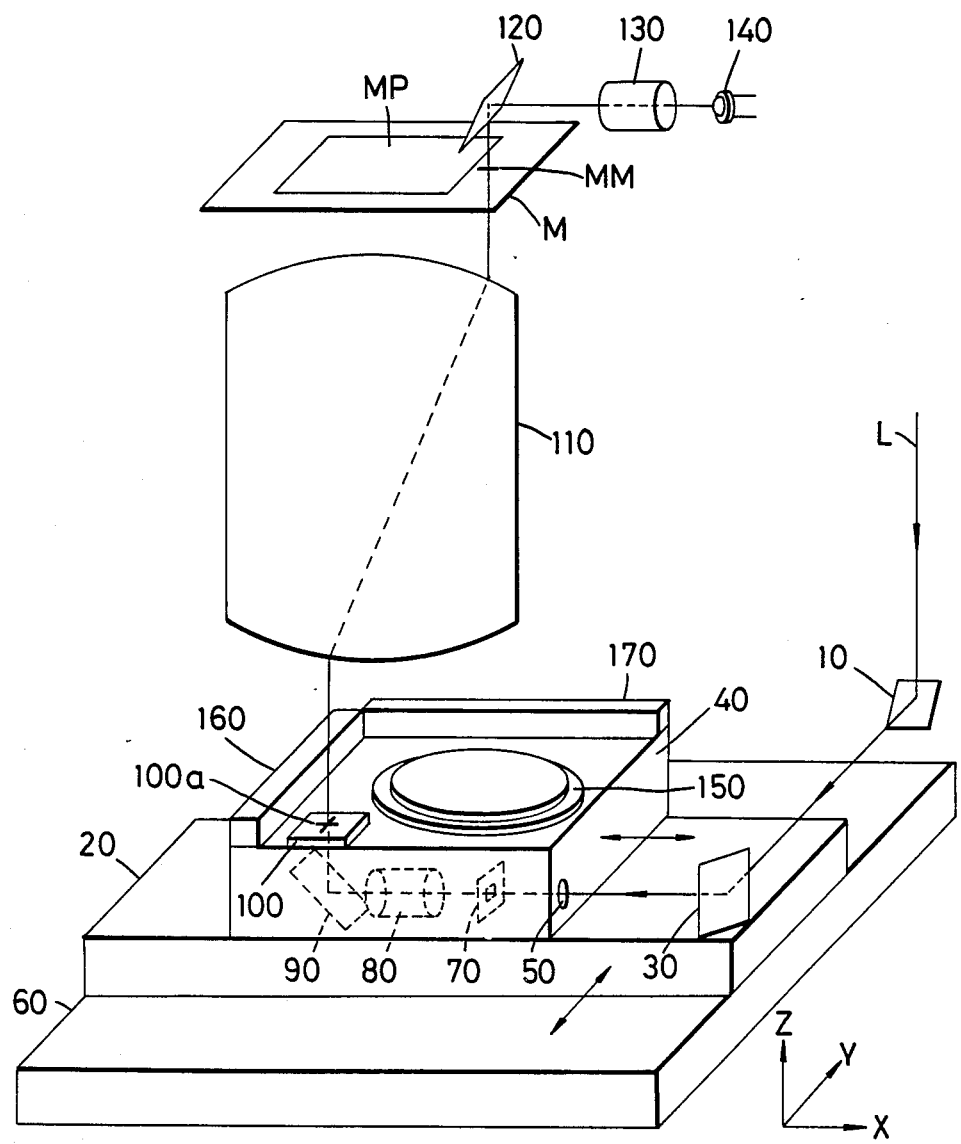
FIG. 1 shows the construction of an embodiment of the present invention.

FIG. 1 shows the construction of an embodiment of the present invention. The construction of the present embodiment will hereinafter be described along the optical path.

A laser beam L which has branched off from a main illuminating system is reflected by a mirror 10 secured to the apparatus outside a stage, travels along an optical path parallel to the Y-axis, is further reflected by a mirror 30 provided on a Y stage 20, and travels along an optical path parallel to the X-axis.

Subsequently, the laser beam L which has travelled along the optical path parallel to the X-axis enters an X stage 40 through an introduction port 50 provided in a side of the X stage 40.

The X stage 40 is installed for movement on the Y stage 20 in X direction, and the Y stage 20 is installed for movement on a stand 60 in Y direction.

Subsequently, the laser beam L which has entered the X stage 40 through the introduction port 50 has its beam diameter stopped down by a stop 70 provided on the optical path thereof. In this case, the beam diameter of the laser beam L is made sufficiently larger than the diameter of the stop 70, whereby even if the X stage 40 moves finely in Z direction, the laser beam L may not deviate from the aperture of the stop 70.

Subsequently, the laser beam L which has passed through the stop 70 has its beam diameter adjusted by a beam expander optical system 80. The laser beam L is then reflected by a mirror 90, travels in a direction parallel to the Z-axis and illuminates the pattern 100a of a regulation plate 100 as the reference member of the present invention provided on the X stage 40.

Subsequently, the laser beam L transmitted through the pattern 100a of the regulation plate 100 reaches a mask M through a projection lens 110, and forms the projected image of the pattern 100a of the regulation plate 100 on the pattern surface of the mask M.

Further, the laser beam L transmitted through the mask M is received by a photodetector 140 via a mirror 120 and a condensing lens 130. A circuit pattern MP to be exposed onto a wafer W is formed on the mask M.

The wafer W is held by a wafer holder 150 provided on the X stage 40. The reference numerals 160 and 170 designate reflecting mirrors for measuring the positions of the X stage 40 in X direction and Y direction by the use of an interferometer (not shown).

The operation of the apparatus constructed as described above will now be described.

First, the laser beam L which has branched off from the main illuminating system is directed into the X stage 40 through a mirror system as described above, and illuminates the regulation plate 100 from below it. The projected image of the pattern 100a on the regulation plate 100 is then formed on the mask M through the projection lens 110. At this time, the image of the pattern 100a is moved on the X stage 40, whereby a slit-like mark MM provided on the mask M is scanned. The then variation in quantity of light is received by the photodetector 140 via the mirror 120 and the condensing lens optical system 130.

Figure 2A:
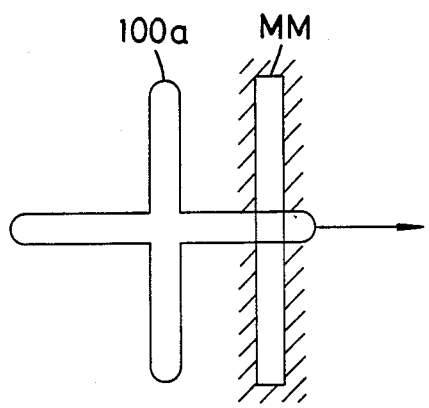
FIG. 2A illustrates the manner in which the projected image of a pattern on a regulation plate scans a mark on a mask.
Figure 2B:
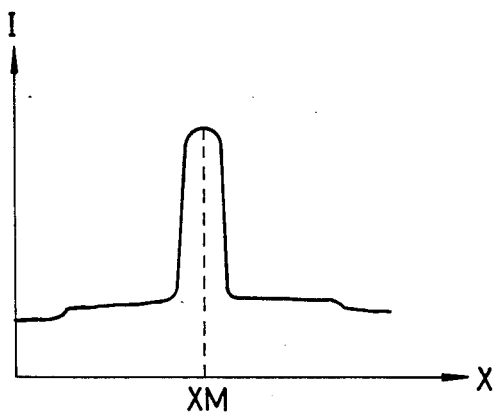
FIG. 2B is a wave form signal graph showing the variation in quantity of light in the case of FIG. 2A relative to the position of an X stage.

FIG. 2A shows the manner in which the image of the pattern 100a on the regulation plate 100 scans the mark MM on the mask M. FIG. 2B shows the variation in quantity of light caused by said scanning. When, in FIG. 2A, that portion of the image of the pattern 100a which is parallel to the mark MM has overlapped the mark MM, the quantity of light received by the photodetector 140 becomes maximum. In this case, the quantity of light at a position XM in FIG. 2B corresponds thereto. By measuring the then position of the X stage 40, the relative position of the mask M and the X stage 40 can be known.

Figure 3:
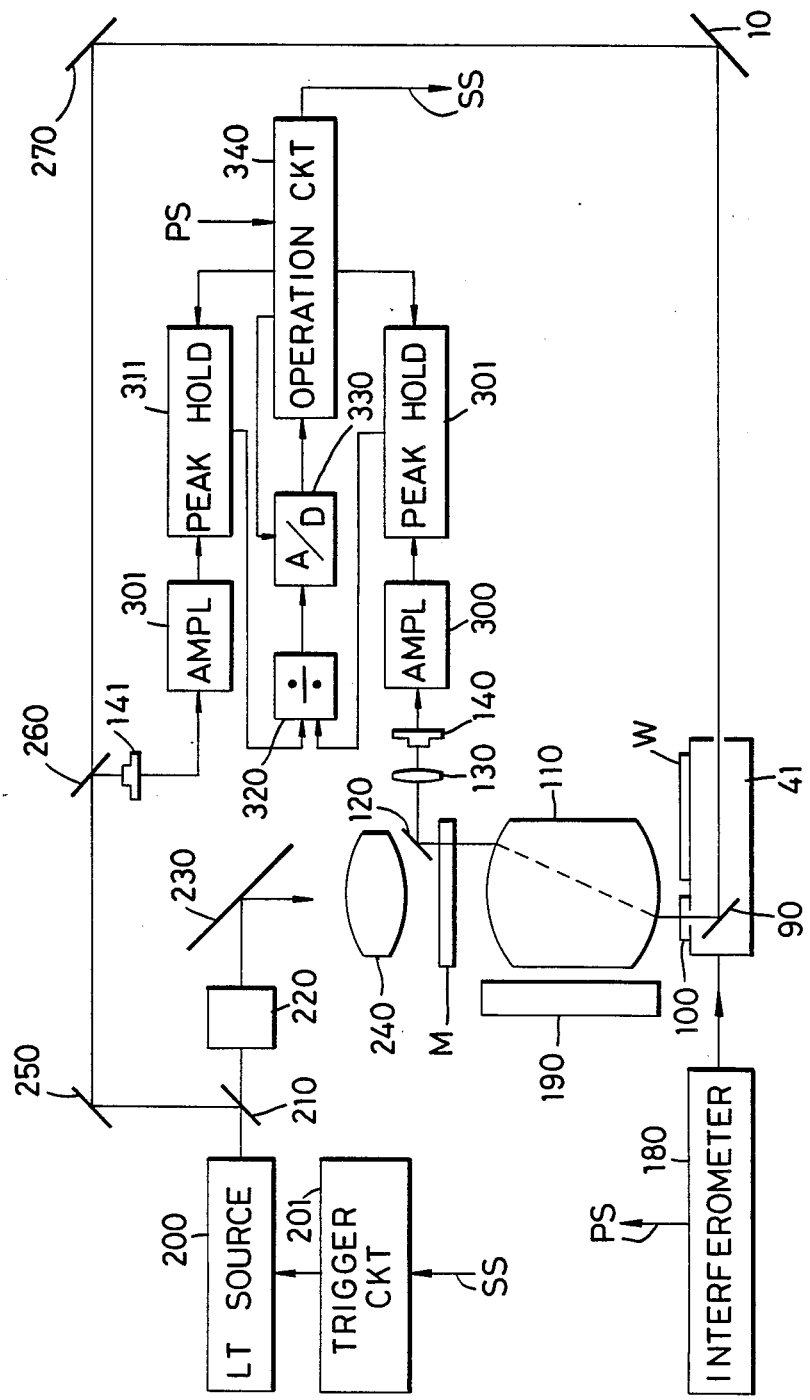
FIG. 3 shows the construction of a second embodiment of the present invention.

A second embodiment of the present invention will now be described with reference to FIG. 3. In FIG. 3, reference numerals identical to those in FIG. 1 designate identical or corresponding portions.

In FIG. 3, a laser beam output from an excimer laser source 200 has a part of it taken out as a regulation light by a beam splitter 210, and the remainder of the laser beam is supplied as exposure light to an illuminating optical system for exposure.

The exposure light transmitted through the beam splitter 210 reaches a mask M via an illuminating optical system 220, a mirror 230 and a condenser lens 240, and uniformly illuminates the mask M. The exposure light transmitted through the mask M reaches a wafer W through a projection lens 110, and transfers and exposes the pattern on the mask M onto the wafer W.

On the other hand, the regulation light taken out by the beam splitter 210 enters a stage 41 via a mirror 250, a beam splitter 260 and mirrors 270 and 10, and illuminates the regulation plate 100 from below it via a mirror 90 provided in the stage 41.

Subsequently, the light transmitted through the light-transmitting pattern of the regulation plate 100 projects and forms the image of the pattern on the regulation plate 100 onto the pattern surface of the mask M through the projection lens 110. The light transmitted through the corresponding light-transmitting area of the mask M is received by a photodetector 140 via a mirror 120 and a condensing lens 130, and is photoelectrically converted thereby.

On the other hand, a part of the regulation light is divided by the beam splitter 260, is received by a photodetector 141 and is photoelectrically converted thereby. This signal is utilized as a reference signal.

Subsequently, the photoelectric signals from the photodetectors 140 and 141 are amplified to suitable magnitudes by amplifiers 300 and 301, respectively. Subsequently, the pulse-like photoelectric signals amplified by the amplifiers 300 and 301 have their peak values held in peak hold circuits 310 and 311, and are input to a divider 320. The divider 320 constitutes an AGC (auto gain control) circuit, and divides the signal of the regulation light from the photodetector 140 by the reference signal from the photodetector 141, and supplies the resultant signal to an A-D converter 330. The A-D converter 330 is controlled by an operation circuit 340 so as to A-D-convert the signal from the divider 320 in synchronism with the position signal PS of an interferometer 180 which reads the position of the stage 41. The interferometer 180 outputs the position signal PS each time the stage is moved by a predetermined amount. The operation circuit 340 is comprised of a microcomputer, a memory circuit, etc., and stores the output of the A-D converter 330 therein in response to the position signal PS of the interferometer 180, and determines the position of the image of the mark MM by the projection lens 110 on the imaging plane of the projection lens 110 on the basis of the result of the storage, and further determines the position of the image of the mask M by the projection lens 110 (for example, the position of the image conforming to the central position of the mask M on the imaging plane of the projection lens 110), and drives the stage on the basis of the result of the determination, and aligns the wafer. Also, the operation circuit 340 outputs a control signal SS to a trigger circuit 201 so that the laser source 200 emits a light in synchronism with the position signal PS of the interferometer 180. The level of the laser beam from the laser source 200 changes each time the laser source emits a light, but the divider 320 normalizes the output of the photodetector 140 by the output of the photodetector 141 and thus, the output of the A-D converter 330 is not affected by the fluctuation of the level of the laser beam from the laser source 200.

The reference numeral 190 designates off-axis observation means as disclosed in U.S. Pat. No. 4,629,313. The off-axis observation means 190 is for finding the position of the pattern of the regulation plate 100 or the mark of the wafer W on the coordinates in the interferometer 180.

Description will now be made of the specific operation of measuring the relative position of the stage 41 and the mask.

Figure 4:
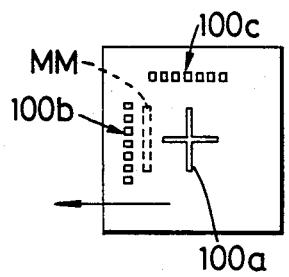
FIG. 4 illustrates the manner in which the pattern on the regulation plate scans the mark on the mask when the position of the mask is measured.

FIG. 4 schematically shows the operation of the regulation plate 100 during measurement. In FIG. 4, the reference character 100a designates the pattern of the light-transmitting area of the regulation plate 100, and the reference characters 100b and 100c denote patterns for measuring the position of the off-axis observation means 190. In this case, the pattern 100a scans over the light-transmitting slit pattern MM for measuring the position of the mask M, whereby from the manner in which the patterns overlap each other, the position on the measured coordinates in the interferometer can be known.

Figure 5A:
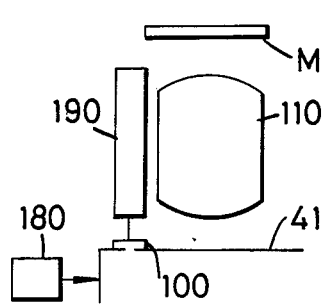
FIG. 5A illustrates the operation of the apparatus when the position of off-axis observation means is measured.
Figure 5B:
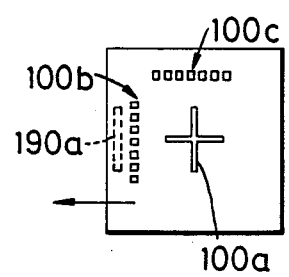
FIG. 5B illustrates the manner in which, in the case of FIG. 5A, the pattern on the regulation plate scans the spot of a laser applied from the off-axis observation means.

FIG. 5A shows the operation when the position of the off-axis observation means 190 is measured FIG. 5B, like FIG. 4, shows the operation of the regulation plate 100 during measurement, and the reference character 190a designates the spot (circular or slit-like) of the laser applied from the off-axis observation means 190. The patterns 100b and 100c are diffraction grating patterns, and by the pattern 100b operating the shown beam spot, there is produced a diffracted light, and the position of the spot 190a, namely, the position of the off-axis observation means 190, is found with the quantity of light of the diffracted light as a signal.

Although not clearly shown, two off-axis observation means 190 are provided so that position measurement can be accomplished with respect to both of X direction and Y direction, and in the case of the observation means in X direction, scanning is effected by the pattern 100b as shown in FIG. 3, and in the case of Y direction, scanning is effected by the pattern 100c to thereby find the position thereof.

By the above-described operation, the distance in the coordinates of the interferometer between the projected image of the mask M and the off-axis observation means 190. This distance is usually called the base line amount. When superposition exposure is to be effected on the wafer W, the same mark as the diffraction grating marks 100b and 100c on the regulation plate 100 is preformed at a suitable position on the wafer W, and the position of that mark is measured by the off-axis observation means 190, and the base line amount is added thereto, and the stage is moved and exposure is effected, whereby the mask M and the wafer W can be properly superposed one upon the other.

Not only by the alignment of the mask and the substrate such as the wafer, but also by measuring the position of the pattern placed onto a suitable location on the mask, measurement of the magnification and measurement of the distortion can be accomplished. Further, by moving the stage in the vertical direction and obtaining a signal wave form, the in-focus position can also be measured from the contrast of the signal wave form and the inclination or the like of the crest of the wave form.

Figure 6A:
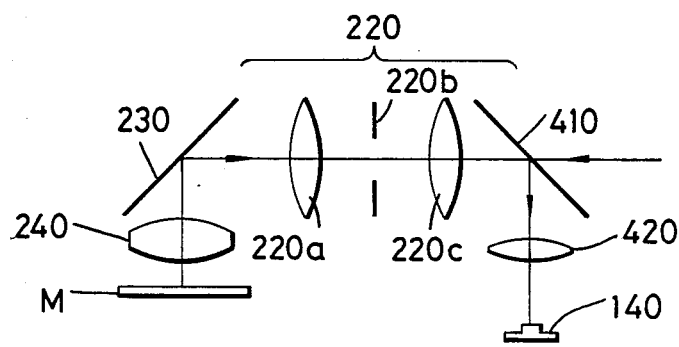
FIGS. 6A and 6B show the construction of a third embodiment of the present invention.
Figure 6B:
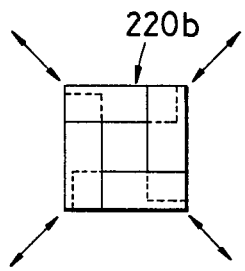

An embodiment of the construction of the optical system which is advantageous for measurement of the magnification and measurement of the distortion is shown in FIGS. 6A and 6B. In this embodiment, the other portions than the light-receiving system above the mask are identical to those in the second embodiment and therefore need not be described. In the present embodiment, a beam splitter 410 is inserted in an illuminating optical system 220 for exposure, and a photodetector 430 is disposed at a location conjugate with the exit pupil as viewed from the stage side of the projection lens 110 so that the regulation light transmitted through the mask M is received by a photodetector 140 through a condensing lens 420. This construction and the operation thereof will hereinafter be described in detail.

The illuminating optical system 220 for exposure uniformly illuminates the mask M through lenses 220c and 220a and a condenser lens 240 by the exposure light incident from the right of FIG. 6A as indicated by arrow. The surface of a blind (field stop) 220b and the pattern surface of the mask M are in an imaging relation. On the other hand, as described in connection with the first and second embodiments, the regulation light illustrates the regulation plate 100 provided on the stage 41 from below it.

Subsequently, the light transmitted through the light-transmitting pattern of the regulation plate 100 projects and forms the image of the pattern on the regulation plate 100 onto the pattern surface of the mask M through the projection lens 110. The light transmitted through the corresponding light-transmitting area of the mask M is imaged and projected onto the blind 220b by the condenser lens 240, the mirror 230 and the lens 220a, and further is received by the photodetector 140 through the lens 220c, the beam splitter 410 and the condensing lens 420.

Also, since the mask M and the surface of the blind 220b are in an imaging relation, four independently movable blades constituting the blind 220b are opened and closed (see FIG. 6B) to change the position and shape of the opening, whereby the observation and field of view (the illuminating field during exposure) of the mask M can be arbitrarily selected.

Since such a construction is adopted, the stage 41 is two-dimensionally moved and the mark of the light-transmitting area predisposed on the mask M is scanned by the light-transmitting pattern on the regulation plate 100, whereby the position of the mark can be easily measured wherever the mark is on the mask. Also, as already described, by operating the blind 220b, the field of view of the pattern surface of the mask M can be arbitrarily limited and therefore, if there is on the mask other pattern having nothing to do with measurement and where there is caused an hindrance in signal processing by the light from said other pattern when position measurement scanning is effected, such an inconvenience can be eliminated by limiting the field of view.

The beam splitter 410 may be a half-mirror, or a total reflection mirror may be inserted during the measurement of the position of the mask and may be taken out during exposure In FIG. 6A, instead of inserting the beam splitter 410, the mirror 230 may be replaced by a beam splitter and a blind may be provided at the imaged position of the mask M separately from the illuminating optical system for exposure, and the once imaged regulation light may be condensed, received and measured. In such case, the operation is entirely identical to that of the embodiment of FIG. 6.

We claim:

1. An exposure apparatus for exposing a substrate by the image of the desired pattern of a mask having a mark and a desired pattern formed thereon by a portion intercepting a light and a portion transmitting the light therethrough, including:
   (a) a light source outputting a laser light;
   (b) first illuminating means for illuminating said mask by at least part of the laser light from said light source;
   (c) a projection optical system for forming the image of said mark on a predetermined surface;
   (d) stage means movable along said predetermined surface with said substrate placed thereon;
   (e) position detecting means for detecting the relative position between said stage means and said mask and outputting a position signal;
   (f) a fiducial member formed integrally with said stage means, said fiducial member having a fiducial pattern disposed so as to be substantially coincident with said predetermined surface and formed by a portion transmitting the light therethrough and a portion intercepting the light;
   (g) a second illuminating optical system for illuminating said fiducial pattern from the opposite side of said projection optical system with respect to said fiducial member, said second illuminating optical system having a plurality of reflecting members for directing at least part of the laser light from said light source to said fiducial pattern;
   (h) first photodetector means for detecting the intensity of the light and outputting a first detection signal;
   (i) means for directing at least part of the laser light from said light source to said first photodetector means;
   (j) a detecting optical system disposed on the opposite side of said projection optical system with respect to said mask;
   (k) second photodetector means for detecting the intensity of the light from said fiducial pattern passed through said projection optical system, said detecting optical system and said mask and outputting a second detection signal;
   (l) normalizing means for normalizing said second detection signal on the basis of said first detection signal; and
   (m) processing means for determining the position of the image of said mark formed on said predetermined surface by said projection optical system, on the basis of said position signal and said second detection signal normalized by said normalizing means.

2. An exposure apparatus according to claim 1, wherein said second illuminating optical system illuminates said fiducial pattern with the laser light from said light source without using an optical fiber.

3. An exposure apparatus for exposing a substrate by the image of the desired pattern of a mask having a mark and a desired pattern formed thereon by a portion intercepting radiation and a portion transmitting the radiation therethrough, including:
   (a) a projection optical system for forming the image of said mark on a predetermined surface;
   (b) stage means movable along said predetermined surface with said substrate placed thereon;
   (c) position detecting means for detecting the relative position between said stage means and said mask and outputting a position signal;
   (d) a fiducial member formed integrally with said stage means, said fiducial member having a fiducial pattern disposed so as to be substantially coincident with said predetermined surface;
   (e) a radiation source;
   (f) an illuminating optical system for illuminating said fiducial pattern with at least part of the radiation from said radiation source;
   (g) first photodetector means for detecting the intensity of the radiation and outputting a first detection signal;
   (h) means for directing at least part of the radiation from said radiation source to said first photodetector means;
   (i) a detecting optical system disposed on the opposite side of said projection optical system with respect to said mask;
   (j) second photodetector means for detecting the intensity of the radiation from said fiducial pattern passed through said projection optical system, said detecting optical system and said mask and outputting a second detection signal;
   (k) normalizing means for normalizing said second detection signal on the basis of said first detection signal; and
   (l) processing means for determining the position of the image of said mark formed on said predetermined surface by said projection optical system, on the basis of said position signal and said second detection signal normalized by said normalizing means.

4. An exposure apparatus according to claim 3, wherein said fiducial member has an area intercepting the radiation and an area transmitting the radiation therethrough, and said projection optical system directs to said mask the radiation from said illuminating optical system passed through said fiducial member 5. An exposure apparatus according to claim 4, wherein said radiation source produces a laser light, and said illuminating optical system has a plurality of reflecting members for directing at least part of the radiation from said radiation source to said fiducial member.

6. An exposure apparatus according to claim 5, wherein said second photodetector means has a radiation receiving surface lying at a position optically substantially conjugate with the exit pupil of said projection optical system with respect to the radiation from said fiducial pattern.

7. An exposure apparatus according to claim 6, further including another illuminating optical system disposed on the opposite side of said projection optical system with respect to said mask for illuminating said mask by at least part of the radiation from said radiation source, and wherein said detecting optical system directs to said second photodetector means at least part of the radiation from said mask passed through said another illuminating optical system.

8. An exposure apparatus according to claim 6, wherein said another illuminating optical system has stop means having a variable aperture, said stop means lying at a position optically substantially conjugate with said mask.

9. An exposure apparatus according to claim 8, further including radiation emission control means for causing said radiation source to emit radiation, and wherein said position detecting a means outputs said position signal each time said stage is moved by a predetermined amount, and said processing means makes said radiation emission control means cause said radiation source to emit radiation each time said position signal is output.

10. An exposure apparatus according to claim 1, wherein said normalizing means divides said second detection signal by said first detection signal.

11. An exposure apparatus for exposing by a substrate the image of the desired pattern of a mask having a mark and a desired pattern formed thereon by a portion intercepting radiation and transmitting the radiation therethrough, including:
 (a) a radiation source;
 (b) a first illuminating optical system for illuminating said mask by the radiation from said radiation source;
 (c) a projection optical system for forming the image of said mark on a predetermined surface;
 (d) stage means movable along said predetermined surface with said substrate placed thereon;
 (e) position detecting means for detecting the relative position between said stage means and said mask and outputting a position signal;
 (f) a fiducial member formed integrally with said stage means, said fiducial member having a fiducial pattern disposed so as to be substantially coincident with said predetermined surface;
 (g) a second illuminating optical system for illuminating said fiducial pattern, said second illuminating optical system having a plurality of reflecting members for directing at least part of the radiation from said radiation source to said fiducial member;
 (h) a detecting optical system disposed on the opposite side of said projection optical system with respect to said mask; and
 (i) photodetector means for detecting the intensity of the radiation from said fiducial pattern passed through said projection optical system, said detecting optical system and said mask and outputting a detection signal, said photodetector means having a radiation-receiving surface disposed at a position optically substantially conjugate with the exit pupil of said projection optical system with respect to the radiation from said fiducial pattern.

12. An exposure apparatus according to claim 11, further including processing means for determining the position of the image of said mark formed on said predetermined surface by said projection lens, on the basis of said position signal and said detection signal.

13. An exposure apparatus according to claim 12, wherein said illuminating optical system has stop means having a variable aperture, said stop means being disposed at a position optically substantially conjugate with said mask.

14. An exposure apparatus according to claim 11, wherein said radiation source produces a laser light.

15. An exposure apparatus for exposing a substrate by the image of the desired pattern of a mask having a mark and a desired pattern formed thereon by a portion intercepting radiation and a portion transmitting the radiation therethrough, including:
 (a) a radiation source;
 (b) a first illuminating optical system for illuminating said mask by the radiation from said radiation source;
 (c) a projection optical system for forming the image of said mark on a predetermined surface;
 (d) stage means movable along said predetermined surface with said substrate placed thereon;
 (e) position detecting means for detecting the relative position between said stage means and said mask and outputting a position signal;
 (f) a fiducial member formed integrally with said stage means, said fiducial member having a fiducial pattern disposed so as to be substantially coincide with said predetermined surface;
 (g) a second illuminating optical system for illuminating said fiducial pattern, said second illuminating optical system having a plurality of reflecting members for directing at least part of the radiation from said radiation source to said fiducial member;
 (h) a detecting optical system disposed on the opposite side of said projection optical system with respect to said mask;
 (i) photodetector means for detecting the intensity of the radiation from said fiducial pattern passed through said projection optical system, said detecting optical system and said mask and outputting a detection signal, said photodetector means having a radiation-receiving surface disposed at a position optically substantially conjugate with the exit pupil of said projection optical system with respect to the radiation from said fiducial pattern; and
 (j) processing means for determining the position of the image of said mark formed on said predetermined surface by said projection optical system, on the basis of said position signal and said detection signal.

16. An exposure apparatus according to claim 15, wherein said radiation source produces a laser light.

* * * * *